(12) United States Patent
Goldblatt et al.

(10) Patent No.: US 9,666,749 B2
(45) Date of Patent: May 30, 2017

(54) LOW RESISTANCE, LOW REFLECTION, AND LOW COST CONTACT GRIDS FOR PHOTOVOLTAIC CELLS

(71) Applicant: International Business Machines Corporation, Armonk, NY (US)

(72) Inventors: Ronald D. Goldblatt, Voorheesville, NY (US); Harold J. Hovel, Katonah, NY (US); Xiaoyan Shao, Yorktown Heights, NY (US); Steven E. Steen, Veldhoven (NL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/093,835

(22) Filed: Apr. 8, 2016

(65) Prior Publication Data

US 2016/0225934 A1    Aug. 4, 2016

Related U.S. Application Data

(62) Division of application No. 13/105,607, filed on May 11, 2011, now Pat. No. 9,337,363.

(51) Int. Cl.
*H01L 31/18* (2006.01)
*E04H 4/00* (2006.01)
*H01L 31/0224* (2006.01)
*H01L 31/068* (2012.01)

(52) U.S. Cl.
CPC ............... *H01L 31/18* (2013.01); *E04H 4/00* (2013.01); *H01L 31/022433* (2013.01); *H01L 31/068* (2013.01); *H01L 31/1804* (2013.01); *Y02E 10/547* (2013.01); *Y02P 70/521* (2015.11); *Y10T 29/49002* (2015.01); *Y10T 29/49826* (2015.01)

(58) Field of Classification Search
CPC ............ H01L 31/18; H01L 31/022433; H01L 31/068; H01L 31/1804
USPC ......................................................... 136/256
See application file for complete search history.

(56) References Cited

U.S. PATENT DOCUMENTS

| 3,993,491 | A | 11/1976 | Feldstein |
| 4,359,487 | A | 11/1982 | Schneider |
| 4,388,483 | A | 6/1983 | Basol et al. |
| 4,595,790 | A | 6/1986 | Basol |

(Continued)

FOREIGN PATENT DOCUMENTS

| WO | WO 2008023795 | 2/2008 |
| WO | WO 2009044996 | 4/2009 |

OTHER PUBLICATIONS

Schwarzacher, "Electrodeposition: A Technology for the Future," The Electrochemical Society Interface, pp. 32-35, Spring 2006.

*Primary Examiner* — Jayne Mershon
(74) *Attorney, Agent, or Firm* — Law Office of Charles W. Peterson, Jr.; Louis J. Percello, Esq.

(57) ABSTRACT

The instant disclosure relates to contact grids for use in photovoltaic cells, wherein a cross-section of the contact grid fingers is shaped as a trapezoid, as well as a method of making photovoltaic cells comprising these contact grids. The contact grids of the instant disclosure are cost effective and, due to their thick metal grids, exhibit minimum resistance. Despite having thick metal grids, the unique shape of the contact grid fingers of the instant disclosure allow the photovoltaic cells in which they are employed to retain more solar energy than traditional solar cells by reflecting incoming solar energy back onto the surface of the solar cell instead of reflecting this energy away from the cell.

16 Claims, 6 Drawing Sheets

(56) References Cited

U.S. PATENT DOCUMENTS

| | | | |
|---|---|---|---|
| 4,644,638 A | 2/1987 | Switzer | |
| 4,705,597 A | 11/1987 | Gimpelson | |
| 5,178,685 A | 1/1993 | Borenstein | |
| 6,576,831 B2 | 6/2003 | Woditsch | |
| 6,709,562 B1 | 3/2004 | Andricacos | |
| 7,405,154 B2 | 7/2008 | Cabral, Jr. | |
| 7,560,750 B2 | 7/2009 | Niira | |
| 2001/0035129 A1 | 11/2001 | Chandra et al. | |
| 2004/0005468 A1 | 1/2004 | Steinecker | |
| 2004/0259335 A1 | 12/2004 | Narayanan et al. | |
| 2007/0221270 A1 | 9/2007 | Watsuji et al. | |
| 2009/0104432 A1 | 4/2009 | Gazda | |
| 2010/0075261 A1 | 3/2010 | Clevenger et al. | |
| 2010/0078056 A1 | 4/2010 | Hovel | |
| 2010/0083997 A1 | 4/2010 | Hovel | |
| 2010/0124619 A1 | 5/2010 | Xu et al. | |
| 2010/0126551 A1 | 5/2010 | Okamoto et al. | |
| 2010/0252094 A1 | 10/2010 | Kim et al. | |

LOW RESISTANCE, LOW REFLECTION, AND LOW COST CONTACT GRIDS FOR PHOTOVOLTAIC CELLS

CROSS REFERENCE TO RELATED APPLICATION

The present application is a divisional of U.S. patent application Ser. No. 13/105,607, "LOW RESISTANCE, LOW REFLECTION, AND LOW COST CONTACT GRIDS FOR PHOTOVOLTAIC CELLS" to Ronald Goldblatt et al. filed May 11, 2011, assigned to the assignee of the present invention and incorporated herein by reference.

TECHNICAL FIELD

The instant disclosure relates to contact grids for use in photovoltaic cells, wherein a cross-section of the contact grid fingers is shaped as a trapezoid, as well as a method of making these contact grids. The contact grids of the instant disclosure are cost effective and, due to their metal grid, exhibit minimum resistance. Despite having a thick metal grid, the unique shape of the contact grid fingers of the instant disclosure allow the photovoltaic cells in which they are employed to retain more solar energy than traditional solar cells by reflecting incoming solar energy back onto the surface of the solar cell instead of reflecting the energy away from the cell.

BACKGROUND OF THE DISCLOSURE

Solar cells, or photovoltaic cells, are one of the key technologies being used in the development of sustainable energy. These cells have been used to power space probes, satellites, and to provide electricity in remote areas where other energy sources are not available. Solar cells have also been used in small consumer products, such as calculators, for several years. More recently, hybrid power supplies have been constructed using large-panel solar modules connected to an electrical grid. Most consumers have several low cost options for supplying their electricity needs. Therefore, the ultimate success of any photovoltaic cell will depend upon its ability to efficiently produce electricity at a low cost.

Photovoltaic cells operate by using semiconductors to convert photons from the sun into electricity. More specifically, electricity is produced when photon energy is absorbed in the active region of the photovoltaic cell, and the absorbed energy generates electron-hole pairs. The amount of energy required to generate the electron-hole pairs is known as the band gap energy, and is generally equal to the minimum energy required to excite an electron from the valence band to the conduction band.

In order to recover electrical current when exposed to solar radiation, photovoltaic cells must have electrical contacts, or electrodes, on both their front and rear sides. The contact on the front side of the cell is usually shaped as a grid comprising a plurality of narrow, elongated parallel fingers, and at least one elongated busbar that intersects the fingers at a right angle. Rear contacts may also be configured using a grid design, but more often are made of a fully metal layer. Typically, the area of the solar cell surface covered by the grid is minimized to reduce the reflection of sunlight off the metal grid. On the other hand, it is also desirable for the grid to be as densely populated as possible in order to minimize the overall resistance of the contact structure.

SUMMARY OF THE DISCLOSURE

The present disclosure provides contact grids, and methods of making photovoltaic cells comprising the contact grids, wherein a cross-section of the contact grid fingers is shaped as a trapezoid. The contact grids of the instant disclosure include thick metal grids that are large enough to minimize series resistance. Moreover, due to their unique shape, the contact grids of the instant disclosure minimize the amount of sunlight lost by the photovoltaic cells in which they are employed because the uniquely shaped fingers of these grids prevent solar energy from being reflected away from the solar cell.

One aspect of the present disclosure is a contact grid comprising a plurality of narrow, elongated, parallel fingers; and at least one elongated busbar that intersects all of the parallel fingers at a right angle, wherein the entire cross-section of the parallel fingers is shaped as a trapezoid having a top end that is narrow as compared to a bottom end. Typically, the non-parallel sides of the trapezoidal cross-section have an angle that is greater than about 45 degrees, but less than about 90 degrees, relative to the parallel sides of the trapezoidal cross-section. Accordingly, the top end of the cross-section of the parallel fingers is about 1 micron to about 25 microns narrower than the bottom end of the cross-section. Furthermore, the distance between the parallel fingers is usually about 1 micron to about 5 millimeters. The contact grids are usually formed from a material comprising Ag, Cu, Au, Rh, Ni, Co, Cr, Zn, NiP, CoP, NiB, or CoB.

A second aspect of the present disclosure relates to a photovoltaic cell comprising a contact grid according to the instant disclosure. Specifically, the photovoltaic cell comprises:

(a) a back contact;
(b) a silicon substrate disposed over a top surface of the back contact;
(c) an anti-reflective coating disposed over a top surface of the silicon substrate, wherein the anti-reflective coating comprises a plurality of gaps/openings extending from a bottom surface of the anti-reflective coating that is in contact with the top surface of the silicon substrate to a top surface of the anti-reflective coating; and
(d) a contact grid comprising a plurality of narrow, elongated, parallel fingers; and at least one elongated busbar that intersects all of the parallel fingers at a right angle and that is disposed over the top surface of the silicon substrate, wherein the entire cross-section of the parallel fingers is shaped as a trapezoid having a top end that is narrow as compared to a bottom end.

Each of the plurality of parallel fingers occupies a gap/opening of the anti-reflective coating wherein a bottom of each of the parallel fingers is in contact with the top surface of the silicon substrate, and the entire trapezoidal cross-section of each of the parallel fingers extends above the top surface of the anti-reflective coating. Typically, the non-parallel sides of the trapezoidal cross-section have an angle that is greater than about 45 degrees, but less than about 90 degrees, relative to the parallel sides of the trapezoidal cross-section. Accordingly, the top end of the cross-section of the parallel fingers is about 1 micron to about 25 microns narrower than the bottom end of the cross-section. Furthermore, the distance between the parallel fingers is usually about 1 micron to about 5 millimeters. The contact grids of the instant disclosure are usually formed from a material comprising Ag, Cu, Au, Rh, Ni, Co, Cr, Zn, NiP, CoP, NiB, or CoB.

The silicon substrates of the photovoltaic cells of the instant disclosure usually comprise a P-N or N-P junction that is adjacent to a first surface of the silicon substrate. Photovoltaic cells of the instant disclosure may also comprise an ohmic contact between the contact grid and the silicon substrate. Furthermore, the width of the line of each of the parallel fingers that is in contact with the silicon substrate (i.e., the line width) is typically about 1 micron to about 50 microns.

A third aspect of the present disclosure is a process of making a photovoltaic cell comprising:

(A) providing a photovoltaic cell comprising a back contact, a silicon substrate having a P-N or N-P junction that is adjacent to a first surface of the silicon substrate, and an anti-reflective coating, wherein the silicon substrate is disposed over a top surface of the back contact, and the anti-reflective coating covers a top surface of the silicon substrate;

(B) applying a mask on a top surface of the anti-reflective coating, wherein the mask comprises openings that expose portions of the anti-reflective coating that correspond to a desired contact grid pattern;

(C) selectively etching the exposed portions of the anti-reflective coating to expose portions of the silicon substrate that correspond to the desired contact grid pattern;

(D) thermally treating the mask to form trapezoid-shaped openings at a top portion of the mask, wherein the trapezoid-shaped openings have a narrow opening at a top end of the mask relative to a wide opening at a bottom end of the mask;

(E) forming a contact grid having a plurality of narrow, elongated, parallel fingers by selectively plating the exposed portions of the silicon substrate with at least one plating material through the trapezoid-shaped openings of the mask; and (F) stripping away the mask.

The anti-reflective coating typically comprises silicon nitride, silicon oxide, titanium dioxide, magnesium fluoride, or silicon dioxide, and the plating material typically comprises Ag, Cu, Au, Rh, Ni, Co, Cr, Zn, NiP, CoP, NiB, or CoB material. Spin coating, spraying, lamination, chemical vapor deposition, or inkjet printing methods may all be used to apply the mask to the top of the anti-reflective coating. The mask typically comprises photoresist, wax, or ink.

The contact grid that is formed after the mask is stripped away comprises a plurality of narrow, elongated, parallel fingers wherein an entire cross-section of the parallel fingers is shaped as a trapezoid. In particular, the term "cross-section" refers to the entire portion of the parallel fingers that extends above the top surface of the anti-reflective coating. Typically, the non-parallel sides of the trapezoidal cross-section have an angle that is greater than about 45 degrees and less than about 90 degrees relative to the parallel sides of the trapezoidal cross-section. Accordingly, the top end of the cross-section of the parallel fingers is about 1 micron to about 25 microns narrower than the bottom end of the cross-section. In addition, the distance between the parallel fingers is usually about 1 micron to about 5 millimeters.

After the mask is stripped away, the plated material may be heat treated to form an ohmic contact between the plated material and the silicon substrate. The width of the line of each of the parallel fingers that is in contact with the silicon substrate (i.e., the line width) is usually about 1 micron to about 50 microns.

In a fourth aspect of the disclosure, the above process further comprises forming the contact grid by selectively plating a first plating material on the exposed portions of the silicon substrate, heat treating the first plating material to form an ohmic contact between the first plating material and the silicon substrate, and selectively plating a second plating material on the first plating material until a plurality of narrow, elongated, parallel fingers are formed.

In another aspect of the disclosure, selective plating in the above-described process is performed by an electrodeposition process comprising:

(A) immersing the exposed portions of the silicon substrate in a plating solution comprising the plating material; and (B) utilizing an electrical current to fill the trapezoid-shaped openings of the mask with the plating material from the plating solution.

When an electrical current is used in the plating process, the top surface of the silicon substrate may be used as the plating substrate (cathode) to conduct current. In this process, an electrical contact is formed on a back side of the silicon substrate. An anode is placed parallel to a front side of the silicon substrate, in the plating solution. Light illuminates the top surface of the silicon substrate to induce electrons to move towards the top silicon surface for metal electrodeposition.

In yet another aspect of the disclosure, the plating material is selectively plated using an electroless plating process. For instance, the instant disclosure includes a process for making a photovoltaic cell comprising:

(A) providing a photovoltaic cell comprising a back contact, a silicon substrate having a P-N or N-P junction that is adjacent to a first surface of the silicon substrate, and an anti-reflective coating, wherein the silicon substrate is disposed over a top surface of the back contact, and the anti-reflective coating covers a top surface of the silicon substrate;

(B) applying a mask on a top surface of the anti-reflective coating, wherein the mask exposes portions of the anti-reflective coating that corresponds to a desired contact grid pattern;

(C) selectively etching the anti-reflective coating to expose portions of the silicon substrate that correspond to the desired contact grid pattern;

(D) thermally treating the mask to form trapezoid-shaped openings at a top of the mask, wherein the trapezoid-shaped openings have a narrow opening at a top of the mask relative to a wide opening at a bottom of the mask;

(E) depositing a thin layer of conductive material on the exposed portions of the silicon substrate using an electroless plating, physical vapor deposition (PVD) process;

(F) selectively plating a plating material through the mask pattern to fill the trapezoid-shaped openings using an electrodeposition method that comprises contacting a back surface of the substrate with electricity; and (G) stripping away the mask.

The anti-reflective coating typically comprises silicon nitride, silicon oxide, titanium dioxide, magnesium fluoride, or silicon dioxide, and the plating material typically comprises Ag, Cu, Au, Rh, Ni, Co, Cr, Zn, NiP, CoP, NiB, or CoB material. Spin coating, spraying, lamination, chemical vapor deposition, or inkjet printing methods may all be used to apply the mask to the top of the anti-reflective coating. The mask typically comprises photoresist, wax, or ink. The layer of conductive material typically has a thickness of about 10 nanometers to about 500 nanometers and the conductive material usually comprises NiP, NiB, CoP, or CoB.

Once the trapezoid-shaped openings are filled using the electrodeposition method, and the mask is stripped away, a contact grid comprising a plurality of narrow, elongated, parallel fingers is formed. The entire cross-section of the parallel fingers is shaped as a trapezoid. The term "cross-section," as used herein, refers to the entire portion of the parallel fingers that extends above the top surface of the anti-reflective coating. Typically, the non-parallel sides of the trapezoidal cross-section have an angle that is greater than about 45 degrees and less than about 90 degrees relative to the parallel sides of the trapezoidal cross-section. Accordingly, the top end of the cross-section of the parallel fingers is about 1 micron to about 25 microns narrower than the bottom end of the cross-section. In addition, the distance between the parallel fingers is usually about 1 micron to about 5 millimeters.

After the mask is stripped away, the plated material may be heat treated to form an ohmic contact between the plated material and the silicon substrate. The width of the line of each of the parallel fingers that is in contact with the silicon substrate (i.e., the line width) is usually about 1 micron to about 50 microns.

Finally, another aspect of the disclosure is a method of making a photovoltaic cell comprising:

(A) providing a photovoltaic cell comprising a back contact, a silicon substrate having a P-N or N-P junction that is adjacent to a first surface of the silicon substrate, and an anti-reflective coating, wherein the silicon substrate is disposed over a top surface of the back contact, and the anti-reflective coating covers a top surface of the silicon substrate;

(B) applying a photoresist mask on a top surface of the anti-reflective coating, wherein the photoresist mask comprises non-tapered openings that expose portions of the anti-reflective coating that correspond to a desired contact grid pattern;

(C) selectively etching the exposed portions of the anti-reflective coating to expose portions of the silicon substrate that correspond to the desired contact grid pattern;

(D) selectively plating a layer of a first plating material on to the exposed portions of the silicon substrate through the non-tapered openings of the photoresist mask, wherein the layer of first plating material has a thickness of about 10 nanometers to about 500 nanometers;

(E) forming an ohmic contact between the first plating material and the silicon substrate by heating the first plating material to a temperature between about 200 degrees Celsius and about 600 degrees Celsius for a time between about 1 second and about 10 minutes;

(F) stripping away the photoresist mask;

(G) applying a photoresist mask on top of the anti-reflective coating, wherein the photoresist mask comprises openings extending from a top of the photoresist mask to a bottom of the photoresist mask that expose the first plating material, and wherein the top of the openings are tapered to form a trapezoid shape;

(H) selectively plating a second plating material on to the first plating material through the tapered openings of the photoresist mask to form a contact grid having fingers with a trapezoid-shaped cross-section; and (I) stripping away the photoresist mask.

The anti-reflective coating typically comprises silicon nitride, silicon oxide, titanium dioxide, magnesium fluoride, or silicon dioxide, and the plating material typically comprises Ag, Cu, Au, Rh, Ni, Co, Cr, Zn, NiP, CoP, NiB, or CoB material. Spin coating, spraying, lamination, chemical vapor deposition, or inkjet printing methods may all be used to apply the mask to the top of the anti-reflective coating. The mask typically comprises photoresist, wax, or ink.

The fingers of the contact grid that are formed comprise a cross-section that is shaped as a trapezoid. The term "cross-section" refers to the entire portion of the fingers that extends above the top surface of the anti-reflective coating. Typically, the non-parallel sides of the trapezoidal cross-section have an angle that is greater than about 45 degrees and less than about 90 degrees relative to the parallel sides of the trapezoidal cross-section. Accordingly, the top end of the cross-section of the parallel fingers is about 1 micron to about 25 microns narrower than the bottom end of the cross-section. In addition, the distance between the parallel fingers is usually about 1 micron to about 5 millimeters.

After the mask is stripped away, the plated material may be heat treated to form an ohmic contact between the plated material and the silicon substrate. The width of the line of each of the parallel fingers that is in contact with the silicon substrate (i.e., the line width) is usually about 1 micron to about 50 microns.

The present disclosure further encompasses the photovoltaic cells made according to any of the processes described herein. Any of the processes described herein may further comprise heat treating the plated material to form an ohmic contact between the plated material and the silicon substrate, and the instant disclosure encompasses photovoltaic cells comprising at least one ohmic contact.

DESCRIPTION OF BEST AND VARIOUS EMBODIMENTS OF DISCLOSURE

Figure 1:
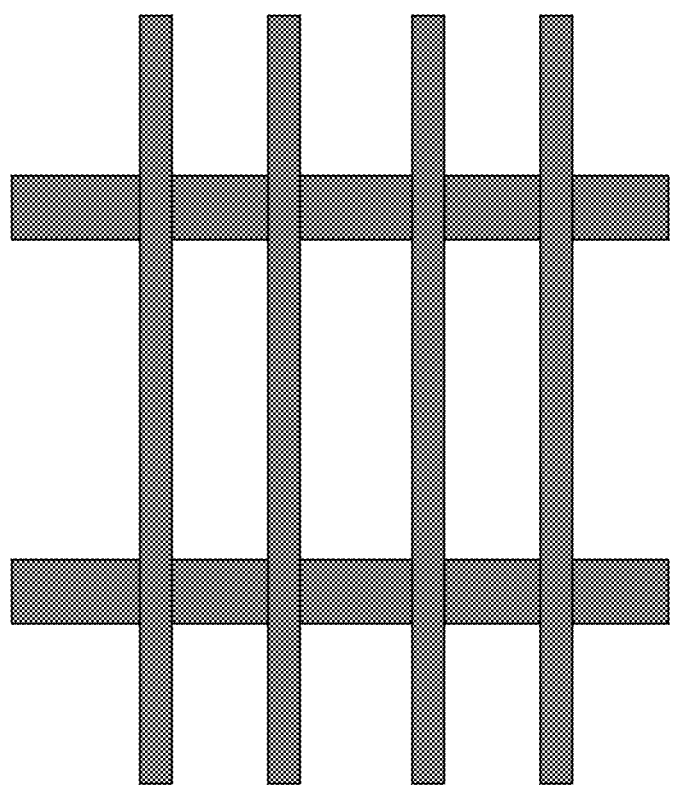
FIG. 1 shows an example of a contact grid structure used on top of a photovoltaic cell.

The present disclosure, which is directed to contact grids for use in photovoltaic cells, as well as methods for making photovoltaic cells comprising these contact grids, will now be described in greater detail by referring to the drawings that accompany the present application. It is noted that in the accompanying drawings, like reference numerals are used for describing like and/or corresponding elements.

FIG. 1 illustrates an example of a completed contact grid having a plurality of narrow, elongated, parallel fingers, and at least one elongated busbar that intersects all of the parallel fingers, that is used on top of photovoltaic cells according to the instant disclosure. The contact grids of the instant disclosure are typically made from a material comprising Ag, Cu, Au, Rh, Ni, Co, Cr, Zn, NiP, CoP, NiB, or CoB.

Figure 2A:
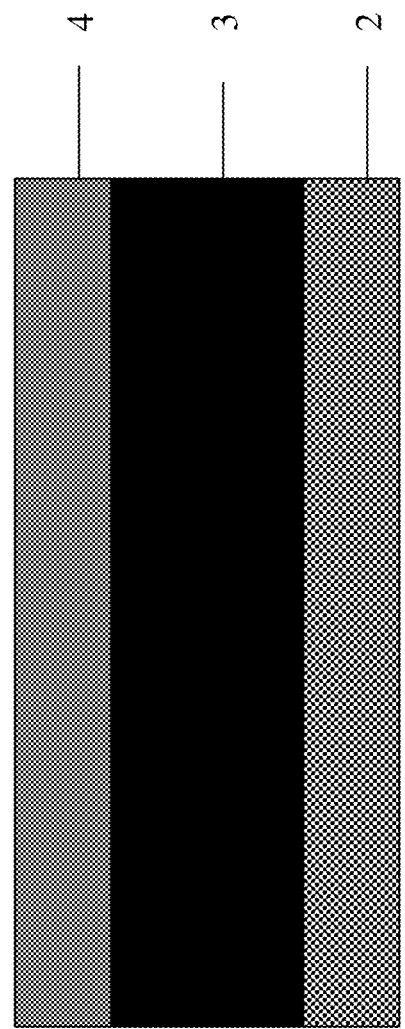
FIG. 2A is a pictorial representation (through a cross-sectional view) of a photovoltaic cell of the present disclosure.

FIGS. 2A-2E illustrate the basic processing steps that are used to form photovoltaic cells of the instant disclosure that comprise contact grids having a plurality of narrow, elongated, parallel fingers, wherein the entire cross-section of the parallel fingers is shaped as a trapezoid. FIG. 2A demonstrates the first step of providing a photovoltaic cell 1 comprising a back contact 2, a silicon substrate 3 disposed over the top surface of the back contact 2, and an anti-reflective coating 4 covering the top surface of the silicon substrate 3.

The silicon substrate 3 comprises a P-N or N-P junction that is adjacent to a first surface of the silicon substrate. Most typically, the silicon substrate 3 is a p-type substrate comprising a layer of n-type dopant over a top surface of the p-type substrate. The n-type dopant is typically deposited over the p-type substrate using techniques such as ion implantation, gas phase diffusion, oxide deposition, or phosphoric acid solution spray.\

Typically, to apply the anti-reflective coating 4 to the silicon substrate 3, the latter is first etched in a buffered solution of hydrofluoric acid to remove surface oxidation and possible adsorbed contaminants. The anti-reflective coating 4 is then applied to the silicon substrate 3 using plasma enhanced chemical vapor deposition (PECVD) or other techniques known in the art, such as atmospheric chemical vapor deposition (APCVD), thermal oxidation, screen printing of pastes, inks or sol gel, etc. Other techniques for depositing these materials may also be employed as are known in the art.

The anti-reflective coating 4 typically comprises silicon nitride, silicon oxide titanium dioxide, silicon dioxide, and/or magnesium fluoride, and has a thickness of about 20 nanometers to about 100 nanometers. As recognized by skilled artisans, the precise oxidation state of the anti-reflective coating may vary depending on the material used and on the manner it is prepared. Oxidation state variations, however, are compensated for by adjusting the thickness of the anti-reflective layer to provide the desired optical properties.

Figure 2B:
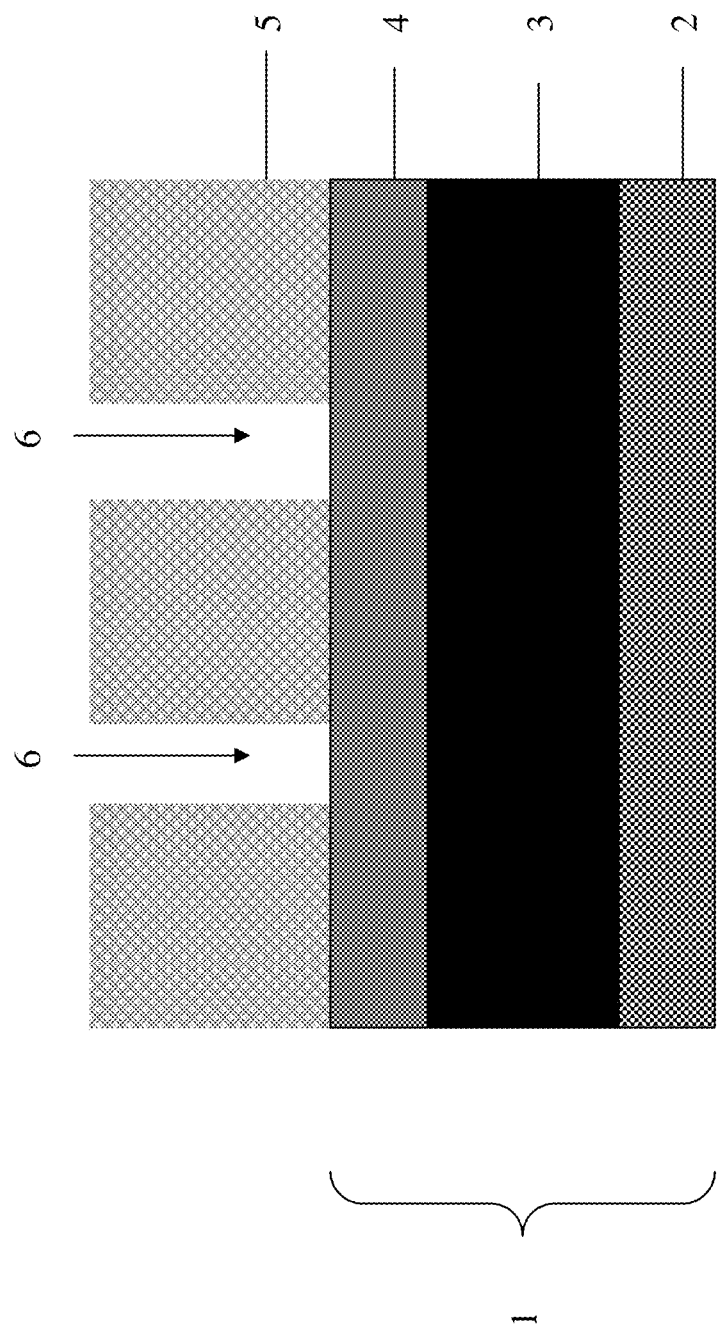
FIG. 2B is a pictorial representation (through a cross-sectional view) of a photovoltaic cell of the present disclosure after a photoresist mask has been applied to the anti-reflective coating.

FIG. 2B depicts the photovoltaic cell of FIG. 2A after the mask 5 has been applied on top of the anti-reflective coating 4. Typically, a spin coating, a spray, a lamination, a chemical vapor deposition, or an inkjet printing method is used to apply the mask 5. Mask materials such as photoresist, wax, or ink are typically used in the methods of the present disclosure.

The mask 5 is applied in a manner that exposes only the areas of the anti-reflective coating 4's surface that corresponds to the desired contact grid pattern. For devices of the present disclosure, the desired contact grid pattern has openings that extend from the top of the mask 5 through the bottom of the anti-reflection coating 4, stopping on the top of the top surface of the silicon substrate 3 so that open trenches 6 are formed from the top of the mask 5 through the bottom of the anti-reflection coating 4 once selective etching is completed. Either an ink mask patterned onto the anti-reflective coating, or a photoresist material that has been patterned by photolithographic means, may be used to provide a masking layer 5 that exposes regions of the anti-reflective coating 4 corresponding to the desired contact grid pattern.

Figure 2C:
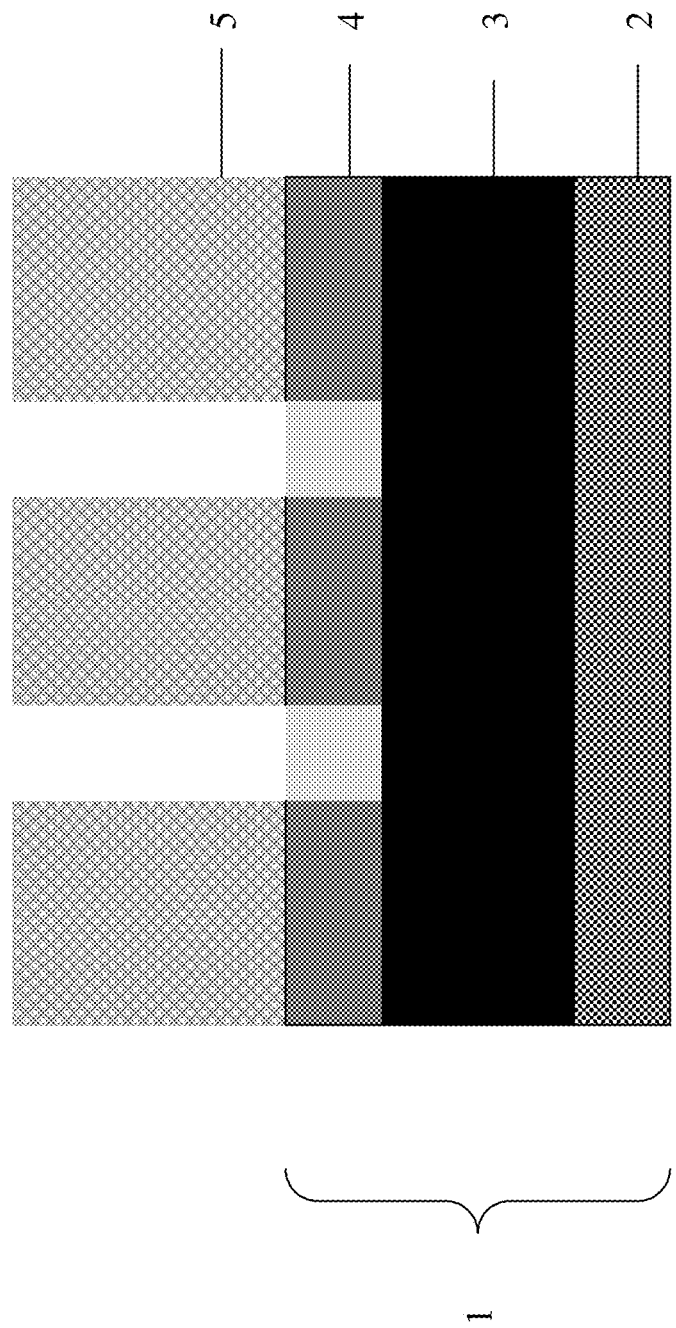
FIG. 2C is a pictorial representation (through a cross-sectional view) of a photovoltaic cell of the instant disclosure after selective etching of the anti-reflective coating has been performed to expose portions of the silicon substrate that correspond to the desired contact grid pattern.

FIG. 2C shows the photovoltaic cell of FIG. 2B after selective etching of the anti-reflective coating has been performed to expose portions of the silicon substrate that correspond to the desired contact grid pattern. Selective etching is achieved by contacting the masked surface with an etching solution chosen to provide selective etching of the particular anti-reflective coating 4 employed on the unmasked areas of the silicon substrate 3. Typically, a concentrated HF solution having an HF concentration between about 1% and about 20% is used to selectively etch silicon nitride and silicon oxide. The etching solution selectively etches the anti-reflective coating 4 in preference to the underlying silicon substrate 3. Thus, the etching solution removes the unmasked regions of the anti-reflective layer 4 that correspond to the desired electrode pattern, thereby exposing the underlying silicon substrate 3.

Figure 2D:
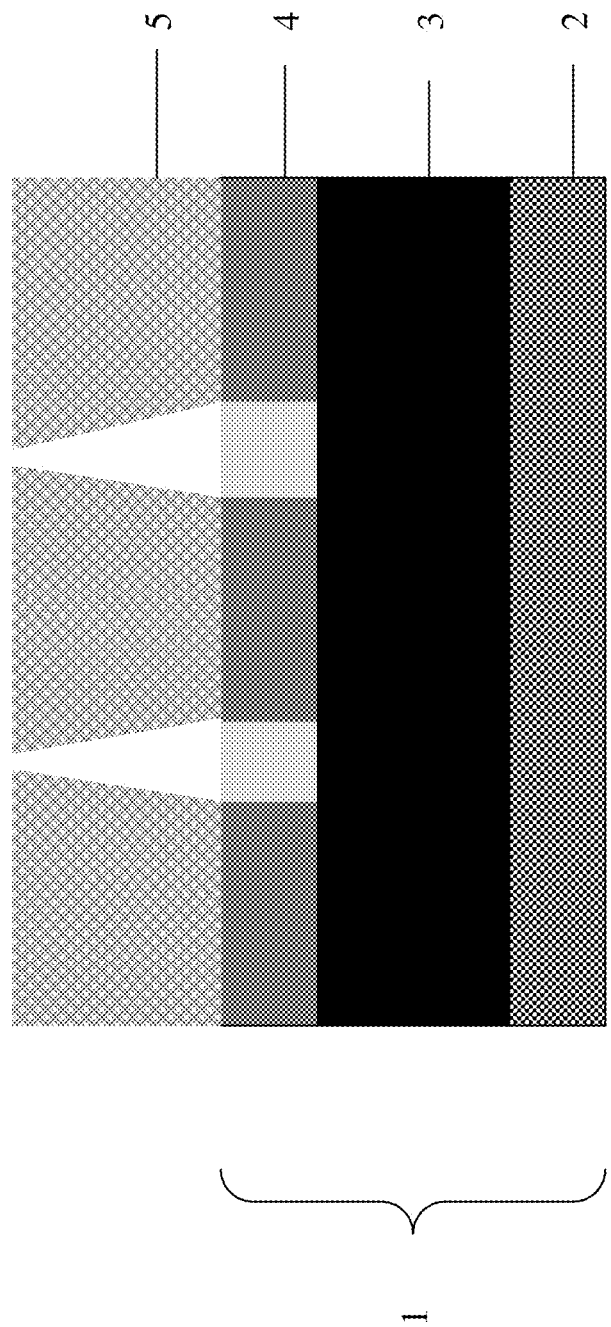
FIG. 2D is a pictorial representation (through a cross-sectional view) of the photoresist used in methods of the instant disclosure, after the photoresist has been thermally treated to form trapezoid-shaped openings.

After selective etching is completed, the mask 5 is thermally treated to form trapezoid-shaped openings. The trapezoid-shaped openings may be obtained in several ways. For instance, the openings may be obtained by applying a reflow method comprising heating the resist to a temperature that is slightly above the glass transition temperature of the polymer backbone of the masking material. For example, a photoresist masking material will begin reflow when baked above 90° Celsius post-development. Therefore, baking the photoresist at a temperature of about 100° Celsius for approximately 20 minutes will reduce the opening size of the trench thereby forming a trapezoidal-shaped opening. The trapezoidal shape can then be optimized by inducing a thermal gradient through the resist by tuning heating zones above the substrate and cooling below the substrate. For instance, in applications where the trapezoid requires smaller openings at the top, one could tune the thermal gradient through the material to have a lower effective temperature, and therefore less thermal reflow, while maintaining a higher temperature on the surface of the material. Tuning the thermal gradient in this manner allows for enhanced reflow that results in smaller openings, thereby establishing a trapezoidal shape in the polymer film. After thermal treatment, the bottom end of the mask opening is wide relative to the top end of the opening as shown in FIG. 2D.

Figure 2E:
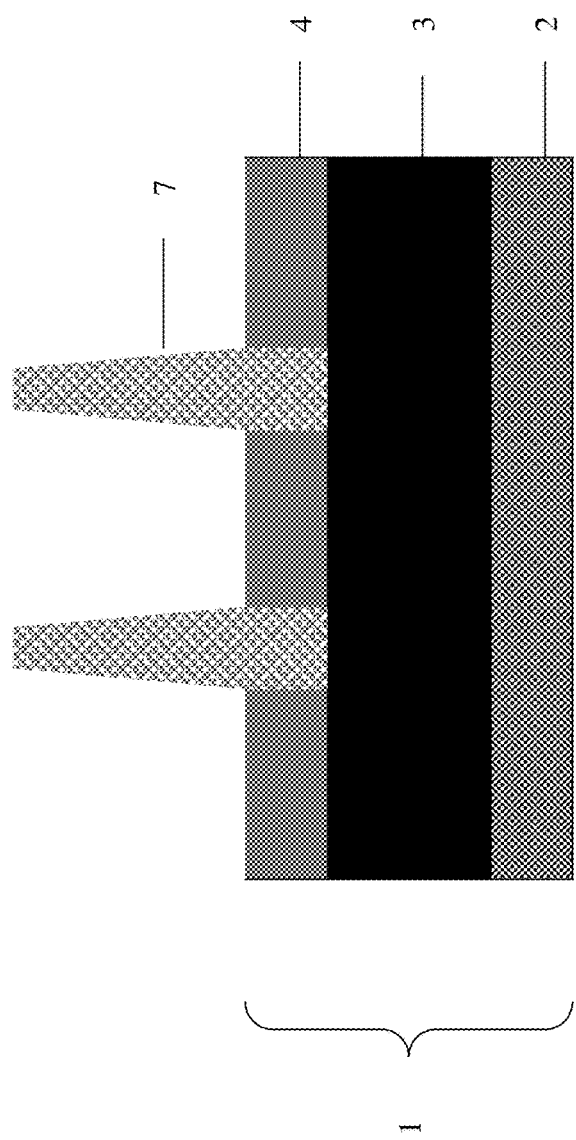
FIG. 2E is a pictorial representation (through a cross-sectional view) of the parallel fingers of the contact grids of the instant disclosure. The entire cross-section of these parallel fingers is shaped as a trapezoid having a top end that is narrower than a bottom end.

Finally, FIG. 2E depicts the fingers 7 of the contact grid that are formed by plating the silicon substrate through the masked pattern to fill up the trapezoidal openings. The fingers of the contact grids of the instant disclosure are unique in that their entire cross-section is trapezoidal in shape so that a top portion of the fingers is narrower than the bottom portion. Typically, the non-parallel sides of the trapezoidal cross-section have an angle that is greater than about 45 degrees and less than about 90 degrees relative to the parallel sides of the trapezoidal cross-section. Accordingly, the top end of the cross-section of the parallel fingers is about 1 micron to about 25 microns narrower than the bottom end of the cross-section. In addition, the distance between the parallel fingers is usually about 1 micron to about 5 millimeters.

The plating materials that may be used in the processes of the instant disclosure, include, but are not limited to, Ag, Cu, Au, Rh, Ni, Co, Cr, Zn, NiP, CoP, NiB, and CoB. Usually an electroless and/or an electrodeposition method is used to plate the silicon substrate through the masked pattern.

Electroless plating generally refers to the autocatalytic or chemical reduction of aqueous metal ions to metal atoms on a substrate without application of an electrical current. Specifically, electroless metal deposition is a process of autocatalytic nucleation and growth, and typically requires a catalyst, e.g., palladium catalyst, to initiate the reaction. Electroless plating is usually performed by heating a solution comprising the metal to be plated, to a specific deposition temperature. The specific deposition temperature usually corresponds to at least the minimum deposition temperature. Once the solution is heated to the specific deposition temperature, it is pumped into a plating chamber. The heated solution is then contacted with the substrate to be plated in the plating chamber. The electroless plating begins at or near the time the plating solution contacts the substrate.

In addition to containing the metal to be plated, the solutions used in electroless plating may also comprise a pH adjusting agent, a buffer, a complexing agent, a stabilizer, and/or one or more surfactants. Examples of pH stabilizers include an amine, an ammonium hydroxide, or a hydroxy amine. The pH adjusting agent is typically added to the solution in order to increase the pH of the solution. The pH adjusting agent may be added to the solution in order for the solution to have a pH of from about 7.5 to about 11.0. The buffer may be boric acid or an ammonium salt, and the complexing agent may be an amino acid, a hydroxy acid, or an ammonium salt thereof.

Complexing agents that may be used in accordance with the disclosure include amino acids, hydroxy acids, or their ammonium salts. The complexing agent complexes with metal ions to make the solution more stable. Additional complexing agents that may be used include pyrophosphate salts, pyrophosphoric acid, and ammonium salts of pyrophosphoric acid. Additional examples include succinic acid, malic acid, glycine, tartaric acid, citric acid, and their ammonium salts.

A buffer may be added to the electroless plating solution in order to maintain the pH of the solution within a desired range. Buffer agents that may be used include boric acid, ammonium salts, and mixtures thereof. Examples of buffers include ammonium sulfate, ammonium chloride, and ammonium acetate.

In addition, the electroless plating solution may further include one or more surfactants and one or more stabilizers. The use of a surfactant or stabilizer is optional. Any suitable surfactant can be chosen for use in the present disclosure as long as the surfactant does not adversely interfere with the deposition process. Stabilizers may include organic sulfurous compounds, e.g., thiourea and benzosulfimide.

Selective plating of a material suitable for plating through the mask pattern to fill the trapezoid-shaped openings may also be accomplished by using an electrodeposition process. Electrodeposition, also known as electroplating, uses electrical current to reduce cations of a desired material from a solution and coat a conductive object with a thin layer of the material, such as a metal. This process operates like a galvanic cell in reverse wherein the substrate to be plated is the cathode, and the metallic plating material is the anode. During electrodeposition, a substrate to be plated, as well as the metallic plating material, are immersed in an electrolyte solution containing dissolved metal salts as well as other ions that permit the flow of electricity. Electricity is then applied to supply a direct current to the metallic plating material which causes the metal atoms to be oxidized and to dissolve in solution. The dissolved metal ions in the electrolyte solution are reduced at an interface between the solution and the cathode (i.e., the substrate to be plated), such that they "plate out" onto the substrate. The dissolution rate of the metal atoms is equal to the rate at which the substrate is plated, vis-a-vis the current flowing through the circuit.

Once selective plating is completed, and after the mask is stripped, an ohmic contact between the plated metal of the contact grid and the top surface of the silicon substrate of the photovoltaic cell may optionally be formed by heat treating the plated metal. The plated metal is usually heated to a temperature of between about 200 degrees Celsius and about 500 degrees Celsius for a time between about 1 second and 10 minutes. Use of such heat treatments is advantageous as they may also lower the resistivity of the plated contact grid.

Still other objects and advantages of the present disclosure will become readily apparent by those skilled in the art from the preceding detailed description, wherein it is shown and described preferred embodiments, simply by way of illustration of the best mode contemplated. As will be realized the disclosure is capable of other and different embodiments, and its several details are capable of modifications in various obvious respects, without departing from the disclosure. Accordingly, the description is to be regarded as illustrative in nature and not as restrictive.

The term "comprising" (and its grammatical variations) as used herein is used in the inclusive sense of "having" or "including" and not in the exclusive sense of "consisting only of." The term "consisting essentially of" as used herein is intended to refer to including that which is explicitly recited along with what does not materially affect the basic and novel characteristics of that recited or specified. The terms "a" and "the" as used herein are understood to encompass the plural as well as the singular.

What is claimed is:

1. A process of making a photovoltaic cell comprising:
   (A) providing a photovoltaic cell comprising a back contact, a silicon substrate having a P-N or N-P junction that is adjacent to a first surface of the silicon substrate, and an anti-reflective coating, wherein the silicon substrate is disposed over a top surface of the back contact, and the anti-reflective coating covers a top surface of the silicon substrate;
   (B) applying a mask on a top surface of the anti-reflective coating, wherein the mask comprises openings that expose portions of the anti-reflective coating that correspond to a desired contact grid pattern;
   (C) selectively etching the exposed portions of the anti-reflective coating to expose portions of the silicon substrate that correspond to the desired contact grid pattern;
   (D) thermally treating the mask to form trapezoid-shaped openings at a top portion of the mask, wherein the trapezoid-shaped openings have a narrow opening at a top end of the mask relative to a wide opening at a bottom end of the mask;
   (E) forming a contact grid having a plurality of narrow, elongated, parallel fingers by selectively plating the exposed portions of the silicon substrate with at least one plating material through the trapezoid-shaped openings of the mask; and
   (F) stripping away the mask.

2. The process according to claim 1, wherein the mask is applied to the top surface of the anti-reflective coating using a spin coating, spray, lamination, chemical vapor deposition, or inkjet printing method.

3. The process according to claim 1, wherein the mask comprises photoresist, wax, or ink.

4. The process according to claim 1, wherein the anti-reflective coating comprises silicon nitride, silicon oxide, titanium dioxide, magnesium fluoride, or silicon dioxide.

5. The process according to claim 1, wherein the plating material comprises: Ag, Cu, Au, Rh, Ni, Co, Cr, Zn, NiP, CoP, NiB, or CoB.

6. The process according to claim 1, further comprising forming the contact grid by selectively plating a first plating material on the exposed portions of the silicon substrate, heat treating the first plating material to form an ohmic contact between the first plating material and the silicon substrate, and selectively plating a second plating material on the first plating material until a plurality of narrow, elongated, parallel fingers are formed.

7. The process according to claim 1, further comprising heat treating the plated material to form an ohmic contact between the plated material and the silicon substrate, after stripping away the mask.

8. The process according to claim 1, wherein selective plating is performed by an electrodeposition process comprising:
(A) immersing the exposed portions of the silicon substrate in a plating solution comprising the plating material; and
(B) utilizing an electrical current to fill the trapezoid-shaped openings of the mask with the plating material from the plating solution.

9. The process according to claim 8, wherein the plating material comprises: Ag, Cu, Au, Rh, Ni, Co, Cr, Zn, NiP, CoP, NiB, or CoB.

10. The process according to claim 9, wherein an electrical contact is formed on a back side of the silicon substrate by placing an anode, that is parallel to a front side of the silicon substrate, in the plating solution and inducing electrons to flow towards the top surface of the silicon substrate by illuminating the top surface with light.

11. The process according to claim 6, wherein the material suitable for plating is selectively plated using an electroless plating process.

12. A process for fabricating a photovoltaic cell comprising:
(A) providing a photovoltaic cell comprising a back contact, a silicon substrate having a P-N or N-P junction that is adjacent to a first surface of the silicon substrate, and an anti-reflective coating, wherein the silicon substrate is disposed over a top surface of the back contact, and the anti-reflective coating covers a top surface of the silicon substrate;
(B) applying a mask on a top surface of the anti-reflective coating, wherein the mask exposes portions of the anti-reflective coating that corresponds to a desired contact grid pattern;
(C) selectively etching the anti-reflective coating to expose portions of the silicon substrate that correspond to the desired contact grid pattern;
(D) thermally treating the mask to form trapezoid-shaped openings at a top of the mask, wherein the trapezoid-shaped openings have a narrow opening at a top end of the mask relative to a wide opening at a bottom end of the mask;
(E) depositing a thin layer of conductive material on the exposed portions of the silicon substrate using an electroless plating or a physical vapor deposition process;
(F) selectively plating a plating material through the mask pattern to fill the trapezoid-shaped openings using an electrodeposition method that comprises contacting a back surface of the silicon substrate with electricity; and
(G) stripping away the mask.

13. The process according to claim 12, wherein the mask comprises photoresist, and wherein after the mask is applied, an angle of a slope of a sidewall of the mask relative to the top surface of the anti-reflective coating is about 45 degrees to about 90 degrees.

14. A process for fabricating a photovoltaic cell for a photovoltaic cell comprising:
(A) providing a photovoltaic cell comprising a back contact, a silicon substrate having a P-N or N-P junction that is adjacent to a first surface of the silicon substrate, and an anti-reflective coating, wherein the silicon substrate is disposed over a top surface of the back contact, and the anti-reflective coating covers a top surface of the silicon substrate;
(B) applying a photoresist mask on a top surface of the anti-reflective coating, wherein the photoresist mask comprises non-tapered openings that expose portions of the anti-reflective coating that correspond to a desired contact grid pattern;
(C) selectively etching the exposed portions of the anti-reflective coating to expose portions of the silicon substrate that correspond to the desired contact grid pattern;
(D) selectively plating a layer of a first plating material on to the exposed portions of the silicon substrate through the non-tapered openings of the photoresist mask, wherein the layer of first plating material has a thickness of about 10 nanometers to about 500 nanometers;
(E) forming an ohmic contact between the first plating material and the silicon substrate by heat treating the first plating material to a temperature between about 200 degrees Celsius and about 600 degrees Celsius for a time between about 1 second and about 10 minutes;
(F) stripping away the photoresist mask;
(G) applying a photoresist mask on a top surface of the anti-reflective coating, wherein the photoresist mask comprises openings extending from a top of the photoresist mask to a bottom of the photoresist mask that expose the first plating material, and wherein the top of the openings are tapered to form a trapezoid shape;
(H) selectively plating a second plating material on to the first plating material through the tapered openings of the photoresist mask to form a contact grid having fingers with a trapezoid-shaped cross-section; and
(I) stripping away the photoresist mask.

15. The process according to claim 14, wherein the first and second plating materials are independently selected from a material comprising: Ag, Cu, Au, Rh, Ni, Co, Cr, Zn, NiP, CoP, NiB, or CoB.

16. The process according to claim 15, wherein after the mask is applied in step (B), an angle of a sidewall of the mask relative to a top surface of the anti-reflective coating is about 45 degrees to about 90 degrees.

* * * * *